US007771106B2

(12) United States Patent
Yang et al.

(10) Patent No.: US 7,771,106 B2
(45) Date of Patent: Aug. 10, 2010

(54) LAMP SOCKET, BACKLIGHT ASSEMBLY HAVING THE SAME, DISPLAY DEVICE HAVING THE SAME AND METHOD OF ASSEMBLING A LAMP MODULE

(75) Inventors: Yong-Seok Yang, Asan-si (KR); Jung-Tae Kang, Suwon-si (KR); Jin-Ho Ha, Suwon-si (KR); Yoon-Soo Kwon, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 11/862,986

(22) Filed: Sep. 27, 2007

(65) Prior Publication Data

US 2008/0080182 A1 Apr. 3, 2008

(30) Foreign Application Priority Data

Sep. 28, 2006 (KR) .................. 10-2006-0094461

(51) Int. Cl.
*H01R 33/02* (2006.01)
*F21S 4/00* (2006.01)

(52) U.S. Cl. .............. 362/634; 362/260; 362/443; 362/217.01; 439/239; 439/698; 439/232; 439/263; 439/259

(58) Field of Classification Search .......... 362/634, 362/630, 640, 260, 217.01, 443; 439/239, 439/698, 232, 263, 259, 260
See application file for complete search history.

(56) References Cited

U.S. PATENT DOCUMENTS

| | | | | |
|---|---|---|---|---|
| 2,943,295 A | * | 6/1960 | Stewart | 439/831 |
| 4,918,582 A | | 4/1990 | McIngvale, Jr. et al. | |
| 5,886,758 A | * | 3/1999 | Ibaraki | 349/58 |
| 6,309,236 B1 | * | 10/2001 | Ullrich | 439/226 |
| 7,344,397 B2 | * | 3/2008 | Miyazono | 439/232 |
| 7,399,190 B2 | * | 7/2008 | Ohmori | 439/226 |
| 7,530,828 B2 | * | 5/2009 | Miyazono | 439/232 |

FOREIGN PATENT DOCUMENTS

CN 1797119 A 7/2006

(Continued)

OTHER PUBLICATIONS

EP Search Report, EP 07018912.1, Oct. 8, 2009, 10 pages.

*Primary Examiner*—Jacob Y Choi
(74) *Attorney, Agent, or Firm*—Innovation Counsel LLP

(57) ABSTRACT

A lamp socket with decreased number of components is presented. The lamp socket includes a socket housing and a power supply member. The socket housing has a connecting hole. The power supply member includes a first lamp connecting terminal and a second lamp connecting terminal. The first lamp connecting terminal is inserted into the connecting hole and includes a first fixing portion that extends through the connecting hole and a first guide portion that extends from an end portion of the first fixing portion toward a first inner wall of the connecting hole. The second lamp connecting terminal is inserted into the connecting hole and includes a second fixing portion that extends through the connecting hole and a second guide portion that extends from an end portion of the second fixing portion toward a second inner wall of the connecting hole.

10 Claims, 15 Drawing Sheets

FOREIGN PATENT DOCUMENTS

| EP | 0157296 | A2 | 10/1985 |
| EP | 1873867 | A | 1/2008 |
| EP | 1883138 | A | 1/2008 |
| JP | 2004-294592 | A | 10/2004 |
| JP | 2007048715 | * | 2/2007 |

* cited by examiner

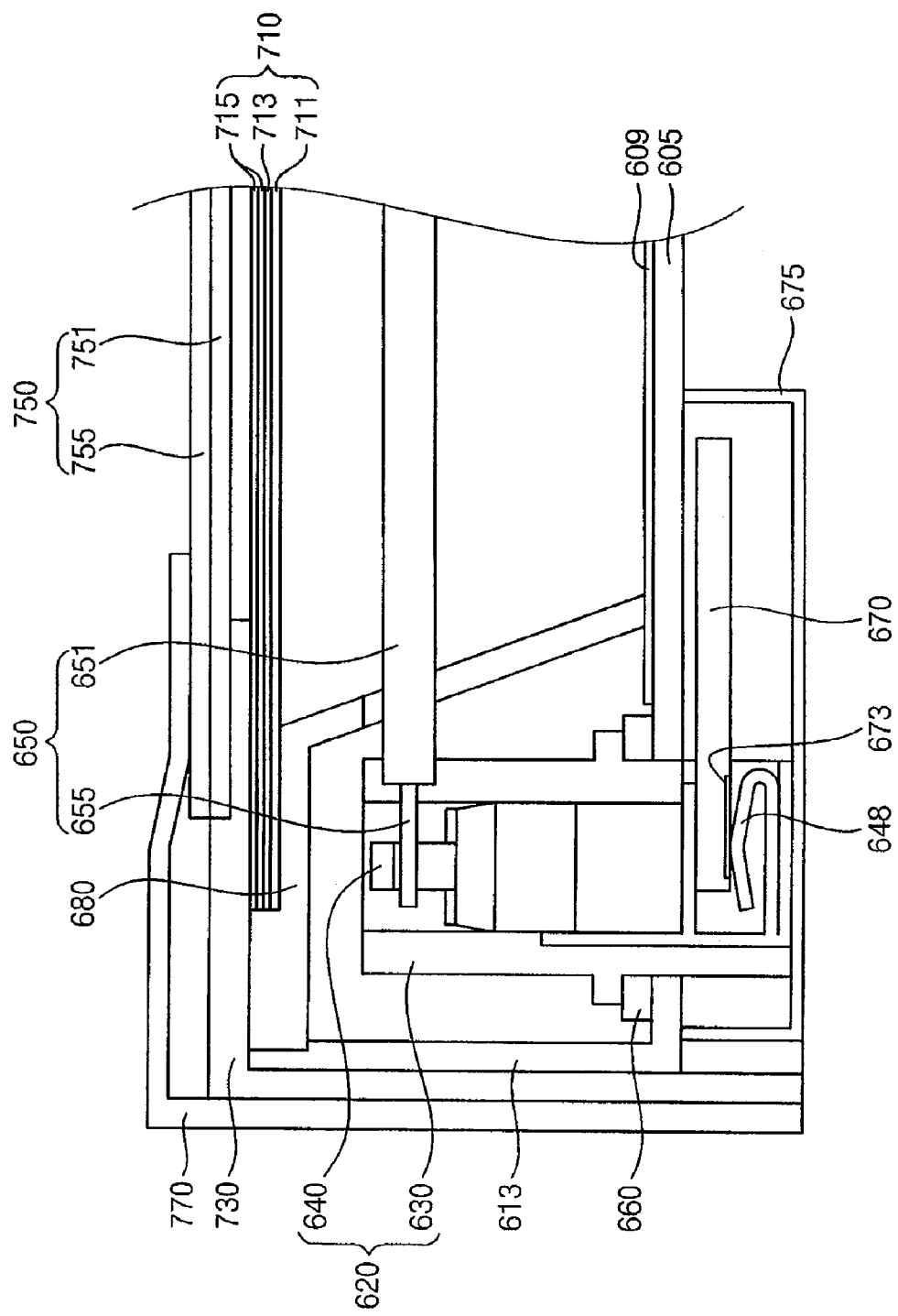

LAMP SOCKET, BACKLIGHT ASSEMBLY HAVING THE SAME, DISPLAY DEVICE HAVING THE SAME AND METHOD OF ASSEMBLING A LAMP MODULE

CROSS-REFERENCE TO RELATED APPLICATIONS

The present application claims priority under 35 U.S.C. §119 to Korean Patent Application No. 2006-94461 filed on Sep. 28, 2006 in the Korean Intellectual Property Office (KIPO), the contents of which are herein incorporated by reference in their entirety.

BACKGROUND OF THE INVENTION

1. Field of the Invention

The present invention relates to a lamp socket, a backlight assembly having the lamp socket, a display device having the lamp socket and a method of assembling a lamp module. More particularly, the present invention relates to a lamp socket for an automated assembly process, a backlight assembly having the lamp socket, a display device having the lamp socket and a method of assembling a lamp module.

2. Description of the Related Art

Backlight assemblies of a liquid crystal display (LCD) device, in general, are classified as either a direct illumination type backlight assembly or an edge illumination type backlight assembly, based on the location of the light source.

A conventional backlight assembly includes a cold cathode fluorescent lamp (CCFL) as the light source. The direct illumination type backlight assembly having the CCFL includes a lamp socket to fix lamps on a bottom plate of a receiving container. In order to easily fix the lamps to the bottom plate, a backlight assembly has been developed that includes a lamp socket combined with an electrode portion of the lamp through a fitting combination.

A conventional lamp socket includes a socket housing, a power supply part and a socket cover. The power supply part electrically connects an inverter with a lead wiring of the lamp. In an assembly process for the lamp socket, the power supply part is inserted into a hole formed in the socket housing, and the lead wiring is inserted into a terminal of the power supply part. The socket cover is inserted into the socket body to fix the lead wiring of the lamp to the lamp socket.

However, there are many elements on the lamp socket, and the socket cover is combined with the socket body after aligning the lamp. Thus, the assembly process is complicated. Also, when the lamp sockets are combined with an aligning plate before the lamp is combined with the lamp socket, the lamp socket is pressed with a lamp loading device, possibly damaging the socket.

In a manufacturing process for assembling the backlight assembly, a wiring of an inverter is soldered to the lamp sockets, or a terminal of the lamp socket is soldered to the inverter.

When the inverter is electrically connected to the sockets through the soldering process, assembly time may be increased and the lamps may be damaged during the soldering process, thereby decreasing yield. In addition, if one of the inverters is defective, all of the lamps need to be removed to replace the defective inverter, thereby increasing repair time.

SUMMARY OF THE INVENTION

The present invention provides a lamp socket with decreased number of elements for an automated assembly process. The present invention also provides a backlight assembly having the above-mentioned lamp socket and a display device having the above-mentioned lamp socket. The present also provides a method of assembling a lamp module.

A lamp socket in accordance with one aspect of the present invention includes a socket housing and a power supply member. The socket housing has a connecting hole. The power supply member includes a first lamp connecting terminal and a second lamp connecting terminal. The first lamp connecting terminal is inserted into the connecting hole and includes a first fixing portion that extends through the connecting hole and a first guide portion that extends from an end portion of the first fixing portion toward a first inner wall of the connecting hole. The second lamp connecting terminal is inserted into the connecting hole and includes a second fixing portion that extends through the connecting hole and a second guide portion that extends from an end portion of the second fixing portion toward a second inner wall of the connecting hole. The first and second inner walls are substantially parallel to each other.

The first and second guide portions may form a substantially V-shape so that a pressure that is applied to the inside of the V-shape would be guided toward opposite walls of the lamp socket. The first and second lamp connecting terminals may form a substantially Y-shape when viewed from a side of the lamp socket. The lamp socket may also include an inverter receiving hole connected to the connecting hole through the socket housing. The power supply member may further include an inverter connecting terminal that is integrally formed with the first and second lamp connecting terminals and is exposed through the inverter receiving hole. The power supply member may further include a connecting part connecting the inverter connecting terminal with the first and second lamp connecting terminals. A first anti-deformation protrusion may be formed on an upper portion of the connection part connected to the first lamp connecting terminal to restrict an amount of bending done by a lower portion of the second fixing portion, and a second anti-deformation protrusion may be formed on the upper portion of the connection part connected to the second lamp connecting terminal to restrict an amount of bending done by a lower portion of the first fixing portion.

A backlight assembly in accordance with another aspect of the present invention includes a receiving container, a plurality of lamps, a plurality of lamp sockets and a power supply substrate. The receiving container includes a bottom plate having a plurality of openings and a sidewall extending from an edge of the bottom plate. The lamps are disposed on the bottom plate, and each of the lamps includes a lamp body and an electrode portion on an end portion of the lamp body. The lamp sockets are received in the openings, and each of the lamp sockets includes a socket housing and a power supply member. The socket housing has a connecting hole that extends toward the bottom plate of the receiving container. The power supply member includes a first lamp connecting terminal and a second lamp connecting terminal. The first lamp connecting terminal is inserted into the connecting hole and includes a first fixing portion pressing on the electrode portion of one of the lamps and a first guide portion that extends from an end portion of the first fixing portion toward a first inner wall of the connecting hole. The second lamp connecting terminal is inserted into the connecting hole and includes a second fixing portion pressing on the electrode portion of the lamp and a second guide portion that extends from an end portion of the second fixing portion toward a second inner wall of the connecting hole. The first and second inner walls are substantially parallel to each other. The power supply substrate is disposed on a rear surface of the bottom plate to generate a lamp driving voltage to the power supply member.

The first and second guide portions of the first and second lamp connecting terminals may form a substantially V-shape. An inverter receiving hole may be formed through the socket housing and extends toward the bottom plate. The power supply member may further include an inverter connecting terminal exposed through the inverter receiving hole. The backlight assembly may further include a connecting plate on the bottom plate and have a plurality of socket fixing portions to receive the lamp sockets, respectively. A side of the power supply substrate may be inserted into the inverter receiving hole, and a plurality of output terminals making contact with an inverter contact terminal may be formed on the side of the power supply substrate.

A backlight assembly in accordance with still another aspect of the present invention includes a receiving container, a lamp, a lamp socket and a power supply substrate. The receiving container includes a bottom plate having an opening and a sidewall extending from an edge of the bottom plate. The lamp is on the bottom plate, and includes a lamp body and an electrode portion on an end portion of the lamp body. The lamp is adjacent to the sidewall. The lamp socket is received in the opening, and includes a socket housing and a power supply member. The socket housing has a connecting hole that extends toward the bottom plate of the receiving container. The power supply member includes a first lamp connecting terminal and a second lamp connecting terminal. The first lamp connecting terminal is inserted into the connecting hole, and includes a first fixing portion pressing on the electrode portion of one of the lamps and a first guide portion that extends from an end portion of the first fixing portion toward a first inner wall of the connecting hole. The second lamp connecting terminal is inserted into the connecting hole, and includes a second fixing portion pressing on the electrode portion of one of the lamps and a second guide portion that extends from an end portion of the second fixing portion toward a second inner wall of the connecting hole. The first and second inner walls are substantially parallel. The power supply substrate is coupled to the bottom plate to provide a lamp driving voltage to the power supply member.

A display device in accordance with still another aspect of the present invention includes a receiving container, a plurality of lamps, a plurality of socket housings, a power supply member, a power supply substrate, a side cover, optical sheets and a display panel. The receiving container includes a bottom plate having a plurality of openings and a sidewall. The lamps are disposed on the bottom plate, and each of the lamps includes a lamp body and an electrode portion on an end portion of the lamp body. The socket housings are received in the openings, and each of the socket housings has an inverter receiving hole exposed below the bottom plate and a connecting hole above the receiving container. The power supply member includes a first lamp connecting terminal, a second lamp connecting terminal, and an inverter connecting terminal. The first lamp connecting terminal is inserted into the connecting hole and includes a first fixing portion pressing on the electrode portion of the lamps and a first guide portion that extends from an end portion of the first fixing portion toward a first inner wall of the connecting hole. The second lamp connecting terminal is inserted into the connecting hole and includes a second fixing portion pressing on the electrode portion of one of the lamps and a second guide portion that extends from an end portion of the second fixing portion and bent toward a second inner wall of the connecting hole. The inverter connecting terminal is received in the inverter receiving hole. The first and second inner walls are substantially parallel to each other. The power supply substrate applies a lamp driving voltage to the inverter connecting terminal, and a side of the power supply substrate is inserted into the inverter receiving hole. The side cover covers the socket housings. The optical sheets are supported by the side cover. The display panel is disposed on the optical sheets.

A method of assembling a lamp module in accordance with yet another aspect of the present invention entails aligning a lamp loading part on an upper portion of a lamp socket including first and second lamp connecting terminals that form a substantially Y-shape. The lamp loading part holds an electrode portion of a lamp. An upper portion of the Y-shaped first and second lamp connecting terminals is pressed with an end portion of the lamp loading part to increase a space between the first lamp connecting terminal and the second lamp connecting terminal. The electrode portion of the lamp is disposed in the space between the first and second lamp connecting terminals. The lamp loading part is removed from the Y-shaped first and second lamp connecting terminals so that the first and second lamp connecting terminals are restored substantially close to their original positions, pressing the electrode portion between them.

The first lamp connecting terminal may be spaced apart from the second lamp connecting terminal by lowering the end portion of the lamp loading part so that the end portion of the lamp loading portion may make contact with the upper portion of the Y-shaped first and second lamp connecting terminals.

According to the lamp socket, the backlight assembly having the lamp socket, the display device having the lamp socket and the method of assembling the lamp module, the number of elements of the lamp socket and the number of processes for assembling the lamp socket may be decreased. Also, a wiring between the lamps and the lamp socket and a wiring between the lamp socket and the power supply substrate may be omitted. Also, a soldering process between the lamps and the lamp socket and a wiring between the lamp socket and the power supply substrate may be omitted. Therefore, a manufacturing process for assembling the backlight assembly and the display device may be simplified, and the power supply substrate may be easily repaired.

BRIEF DESCRIPTION OF THE DRAWINGS

The above and other advantages of the present invention will become more apparent by describing in detail embodiments thereof with reference to the accompanying drawings, in which:

FIG. 14 is a cross-sectional view taken along a line V-V' shown in FIG. 13.

DESCRIPTION OF THE EMBODIMENTS

Figure 1:
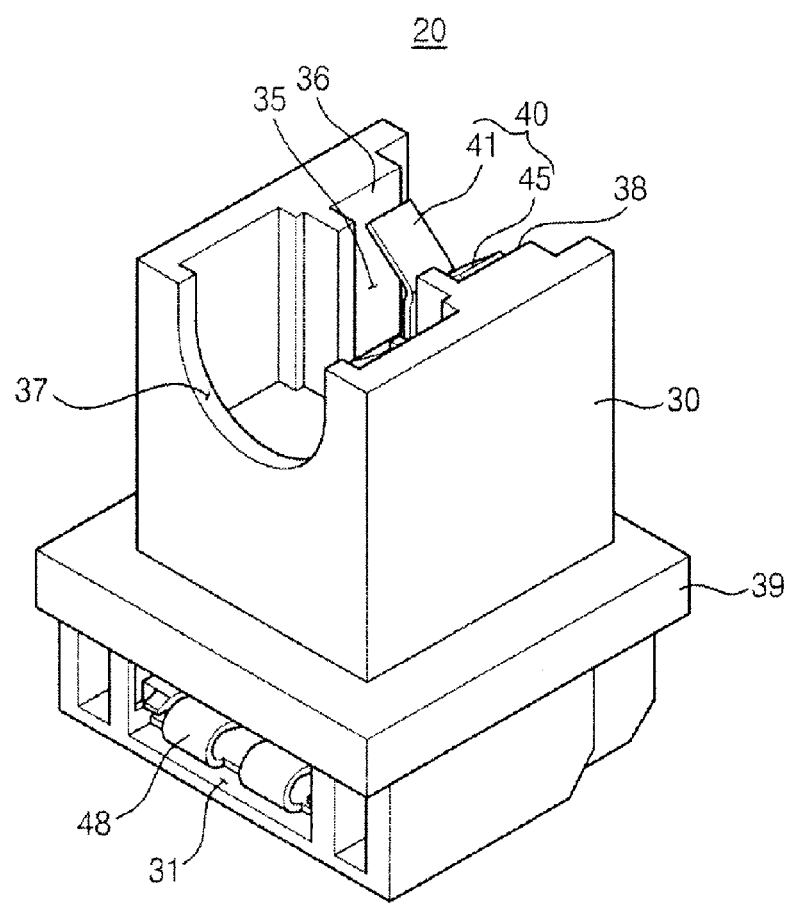
FIG. 1 is a perspective view illustrating a lamp socket in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
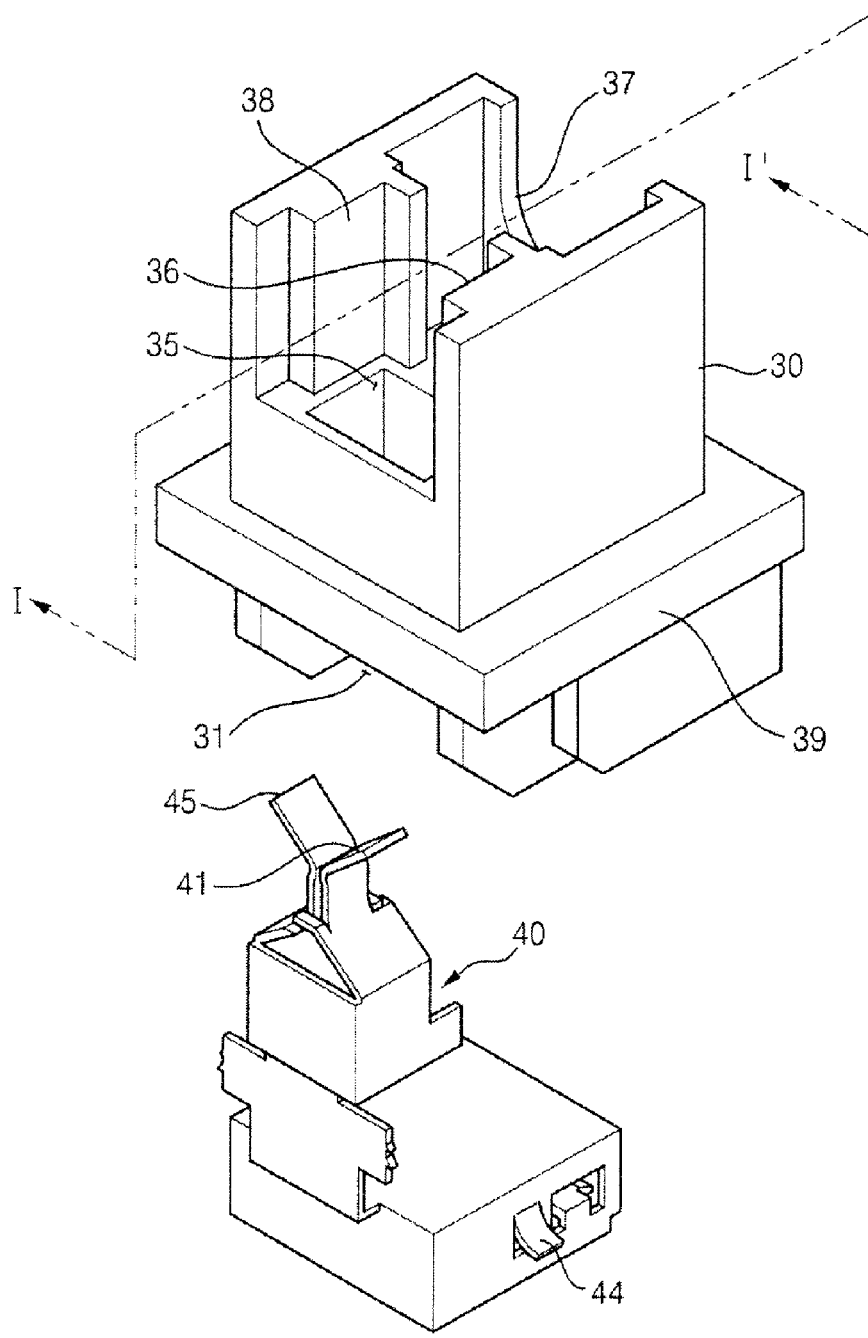
FIG. 2 is an exploded perspective view illustrating the lamp socket shown in FIG. 1.

FIG. 1 is a perspective view illustrating a lamp socket in accordance with one embodiment of the present invention. FIG. 2 is an exploded perspective view illustrating the lamp socket shown in FIG. 1.

Referring to FIGS. 1 and 2, the lamp socket 20 includes a socket housing 30 and a power supply part 40. The lamp socket 20 fixes a plurality of lamps generating light to a receiving container, and applies a lamp driving voltage to the lamps.

The socket housing 30 may be formed through an injection molding process, and may have a substantially parallelepiped shape. A connecting hole 35 may be formed on an upper portion of the socket housing 30, and an inverter receiving hole 31 connected to the connecting hole 35 may be formed on a lower portion of the socket housing 30. For example, the inverter receiving hole 31 may be opened toward the lower portion of the socket housing 30, and the connecting hole 35 is opened toward the upper portion of the socket housing 30. In addition, the inverter receiving hole 31 and the connecting hole 35 may be opened toward opposite sides of the socket housing 30. A catching protrusion 39 is protruded along side surfaces of the socket housing 30 to be combined with an external element. A lamp guide groove 37 having a round shape is formed on the upper portion of the socket housing 30. The lamp guide groove 37 is adjacent to the connecting hole 35.

The power supply part 40 is inserted into the socket housing 30 from the inverter receiving hole 31, and is exposed through the connecting hole 35. The power supply part 40 includes a metal so that an inverter may be electrically connected to an electrode portion of the lamp. The power supply part 40 includes a first lamp connecting terminal 41 and a second lamp connecting terminal 45. The power supply part 40 may further include an inverter connecting terminal 48 that is integrally formed with the first and second lamp connecting terminals 41 and 45. The inverter connecting terminal 48 is exposed through the inverter receiving hole 31, and the first and second lamp connecting terminals 41 and 45 are exposed through the connecting hole 35.

Figure 3:
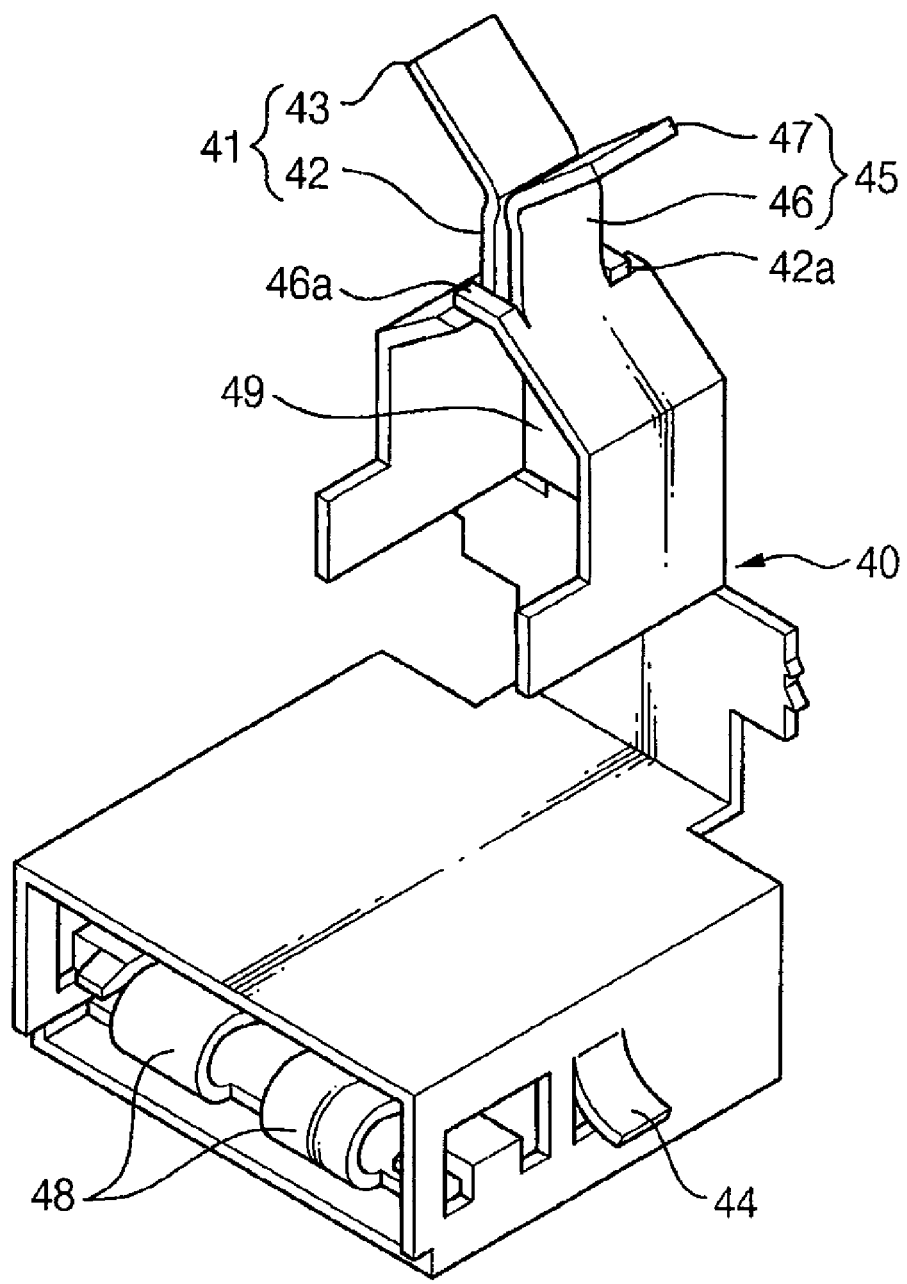
FIG. 3 is a perspective view illustrating a power supply part shown in FIG. 2.
Figure 4:
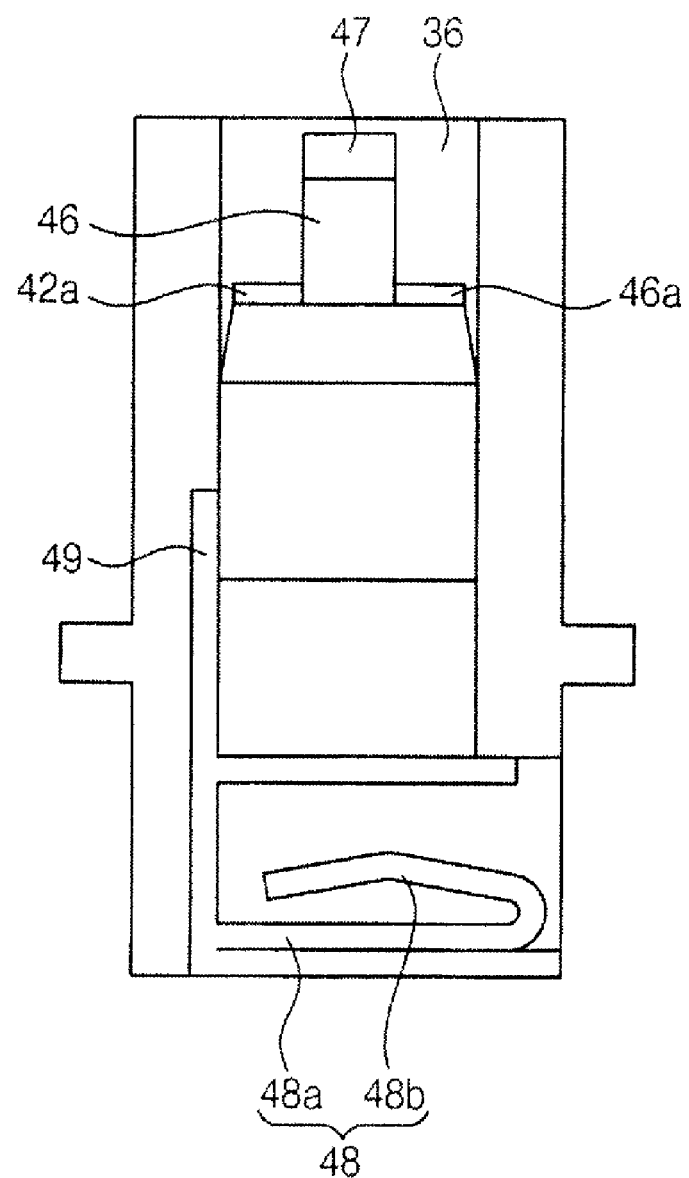
FIG. 4 is a cross-sectional view taken along a line I-I' shown in FIG. 2.

FIG. 3 is a perspective view illustrating the power supply part 40 shown in FIG. 2 from a different angle. FIG. 4 is a cross-sectional view taken along a line I-I' shown in FIG. 2.

Referring to FIGS. 3 and 4, the power supply part 40 may further include a connecting part 49 that is integrally formed with the inverter connecting terminal 48 and the first and second lamp connecting terminals 41 and 45. The connecting part 49 having a planar shape electrically connects the inverter connecting terminal 48 with the first and second lamp connecting terminals 41 and 45.

The first lamp connecting terminal 41 is substantially perpendicular to the connecting part 49, and is connected to a left side of the connecting part 49. The second lamp connecting terminal 45 is substantially perpendicular to the connecting part 49, and is connected to a right side of the connecting part 49.

The first lamp connecting terminal 41 includes a first fixing portion 42 and a first guide portion 43. The first fixing portion 42 is protruded from the left side toward an upper portion of the lamp socket 20. The first guide portion 43 extends from an upper end portion of the first fixing portion 42, and is bent toward an inner wall 36 of the connecting hole 35. The second lamp connecting terminal 45 includes a second fixing portion 46 and a second guide portion 47. The second fixing portion 46 is opposite to the first fixing portion 42, and protrudes from the right side toward the upper portion of the lamp socket 20. The second guide portion 47 opposite to the first guide portion 43 extends from the upper end portion of the second fixing portion 46, and is bent toward an inner wall 38 of the connecting hole 35.

When viewed from a side of the lamp socket 20, the first and second guide portions 43 and 47 are arranged to form a substantially V-shape, and the first and second lamp connecting terminals 41 and 45 are arranged to form a substantially Y-shape. Thus, a pressure that is applied to the lamp socket 20 from the upper portion toward the lower portion is transferred toward opposite sides of the lamp socket 20.

A first anti-deformation protrusion 42a is formed under the first fixing portion 42, and a second anti-deformation protrusion 46a is formed under the second fixing portion 46. The first anti-deformation protrusion 42a restricts a lower portion of the second fixing portion 46, and the second anti-deformation protrusion 46a restricts a lower portion of the first fixing portion 42 so that there is a limit on how much first and second lamp connecting terminals 41, 45 are allowed to bend and separate from each other.

The inverter connecting terminal 48 makes contact with an output terminal of a power supply substrate that is received in the inverter receiving hole 31, and is electrically connected to the output terminal of the power supply substrate. The inverter connecting terminal 48 may have various shapes. For example, the inverter connecting terminal 48 may have a spring shape, such as a leaf spring shape, so that the inverter connecting terminal 48 makes secure contact with the output terminal.

In FIGS. 3 and 4, the inverter connecting terminal 48 includes a supporting portion 48a and an electric power receiving portion 48b. In FIG. 4, the supporting portion 48a extends from the connecting portion 49 along a bottom surface toward a lower portion of a inner side surface of the inverter receiving hole 31. The electric power receiving portion 48b is bent from an end portion of the supporting portion 48a to be overlapped with the supporting portion 48a. The electric power receiving portion 48b has a convex shape extending from the inner side surface of the inverter receiving hole 31. Therefore, the electric power receiving portion 48b is elastically deformed based on an externally provided pressure so that the electric power receiving portion 48b is securely connected to the output terminal.

Figure 5:
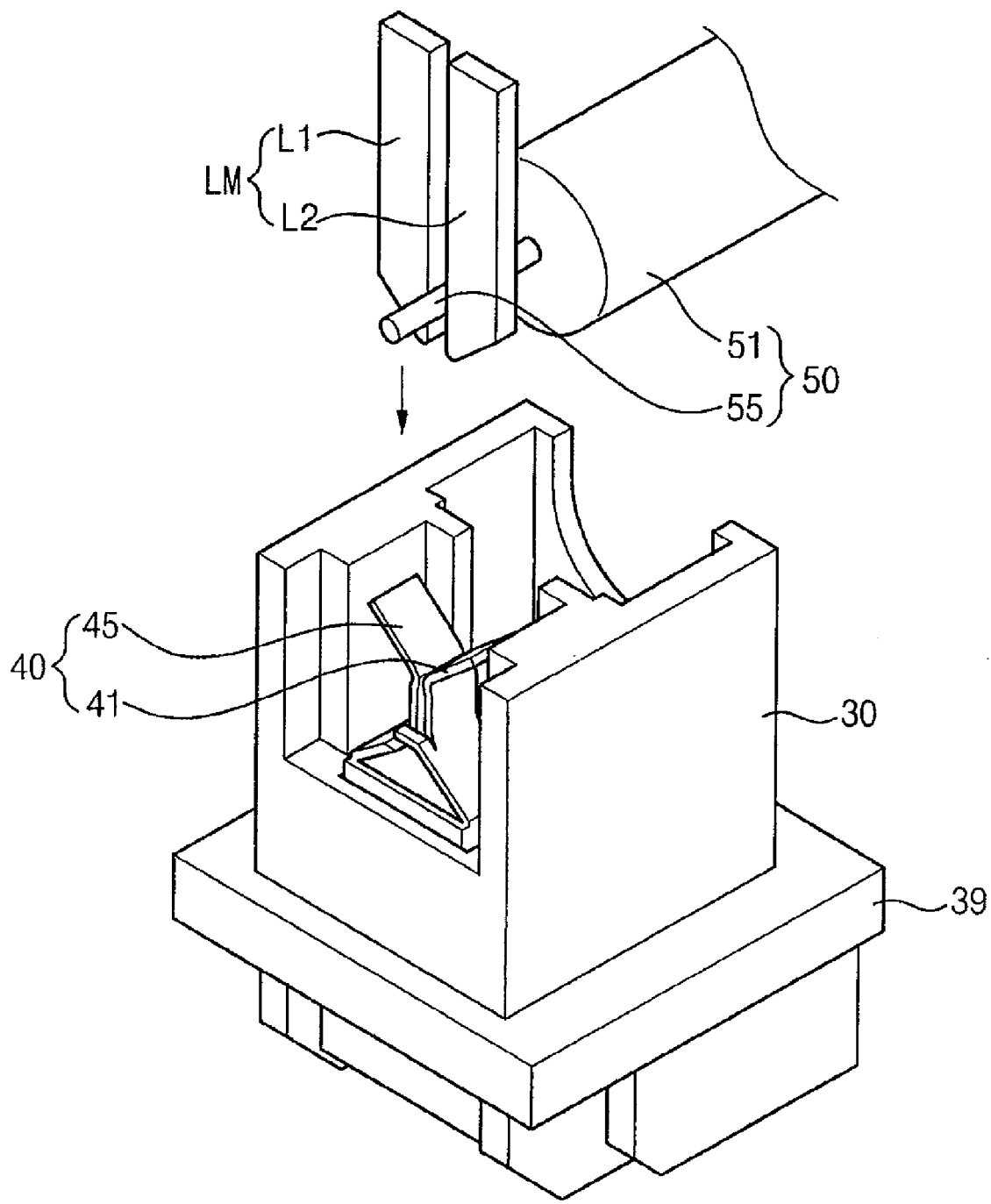
FIG. 5 is a perspective view illustrating a lamp loading module that loads a lamp into the lamp socket shown in FIG. 1.

In FIGS. 4 and 5, the lamp socket 20 is combined with the lamp 50 to form a lamp module, and the lamp module is assembled through an automated assembly process using a lamp loading module. Hereinafter, the method of assembling the lamp module will be described in FIGS. 5 to 6D.

FIG. 5 is a perspective view illustrating a lamp loading module that loads a lamp into the lamp socket shown in FIG. 1.

Referring to FIG. 5, the lamp 50 includes a lamp body 51 and an electrode portion 55 on an end portion of the lamp body 51. The lamp 50 may include a cold cathode fluorescent lamp (CCFL), an external electrode fluorescent lamp (EEFL), etc. When the lamp 50 includes the CCFL, the electrode portion 55 includes a conductive lead wiring. In FIG. 5, the lead wiring has a thin cylindrical shape.

A loading part LM of the lamp loading module includes a first clamp L1 and a second clamp L2. The lead wiring of the lamp 50 is held between the first and second clamps L1 and L2. End portions of each of the first and second clamps L1 and L2 have an inclined surface. When viewed from a side of the lamp loading module, the inclined end portions of the first and second clamps L1 and L2 form a substantially V-shape.

FIGS. 6A to 6D are cross-sectional views illustrating a method of assembling a lamp with the lamp socket shown in FIG. 1.

Figure 6A:
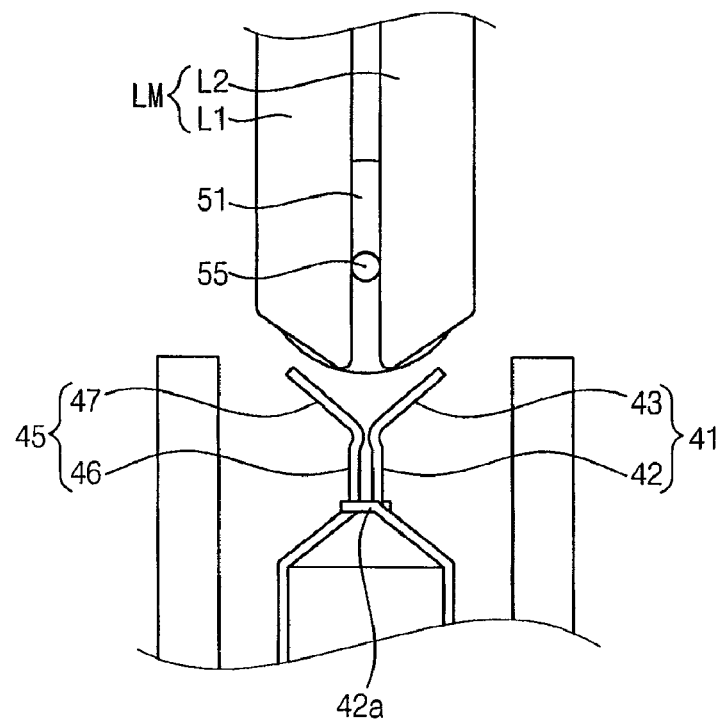
FIGS. 6A to 6D are cross-sectional views illustrating a method of assembling a lamp with the lamp socket shown in FIG. 1.
Figure 6B:
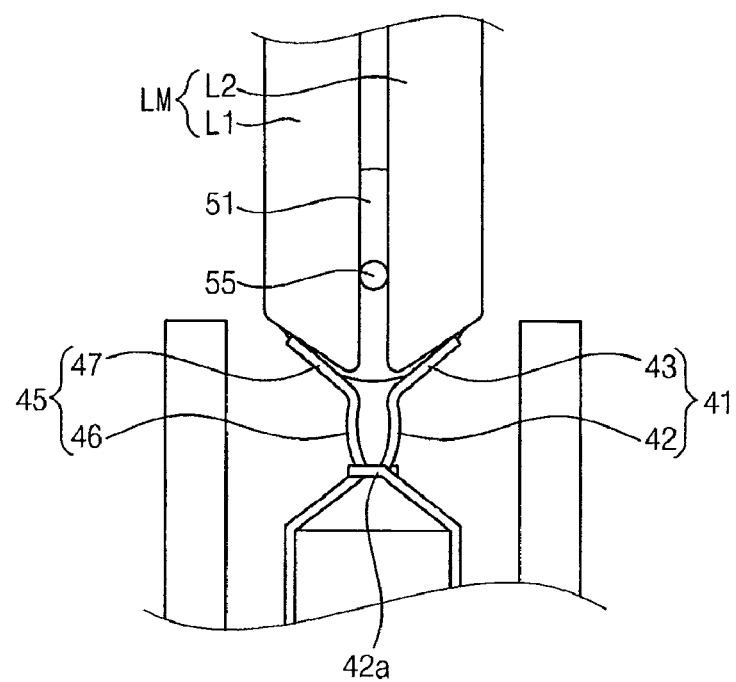

Referring to FIG. 6A, the lamp loading part LM holding the lead wiring of the lamp 50 is lowered from an upper portion of the lamp socket 20. The lowered lamp loading part LM makes contact with first and second lamp connecting terminals 41 and 45 that form a substantially Y-shape as shown in FIG. 6B.

Figure 6C:
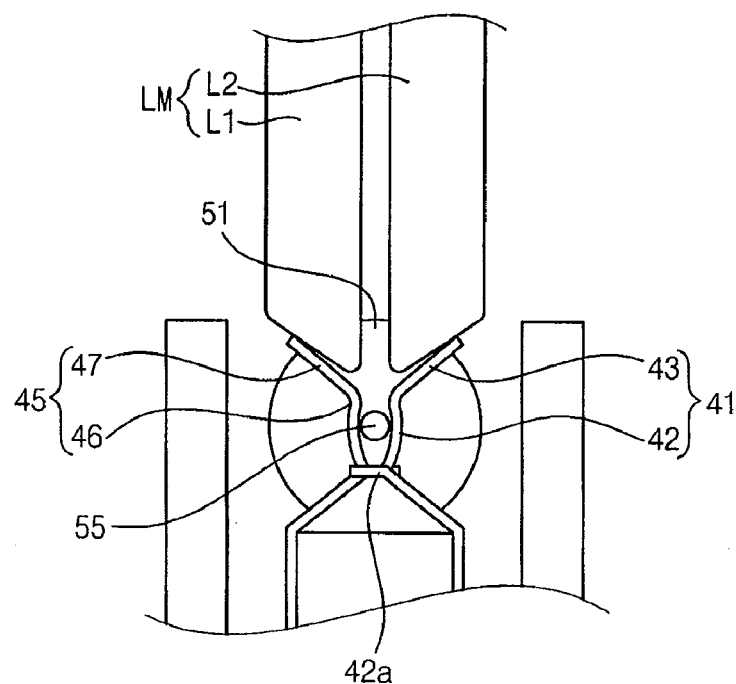

For example, the first guide portion 43 of the first lamp connecting terminal 41 may make contact with the inclined surface of the first clamp L1, and the second guide portion 47 of the second lamp connecting terminal 45 makes contact with the inclined surface of the second clamp L2. When the first and second clamps L1 and L2 are lowered, the first lamp connecting terminal 41 and the second lamp connecting terminal 45 move farther apart from each other. In FIG. 6C, the lead wiring of the lamp 50 is spaced apart from the lamp loading part LM to be received between the first and second fixing portions 42 and 46.

The first and second anti-deformation protrusions 42a and 46a of the first and second fixing portions 42 and 46 prevent the lead wiring of the lamp from being lowered beyond a certain portion of the lamp socket. In addition, the first and second anti-deformation protrusions 42a and 46a prevent the first lamp connecting terminal 41 from separating from the second lamp connecting terminal 45 by a distance greater than the elastic limit of the first and second lamp connecting terminals 41 and 45, even though the lamp loading part LM presses on the Y-shaped first and second lamp connecting terminals 41 and 45.

When the lamp loading part LM is removed from the first and second guide portions 43 and 47, the first and second lamp connecting terminals 41 and 45 are restored to the neutral position and the first and second fixing portions 42 and 46 press on the lead wiring of the electrode portion 55 to hold the lead wiring.

Figure 7:
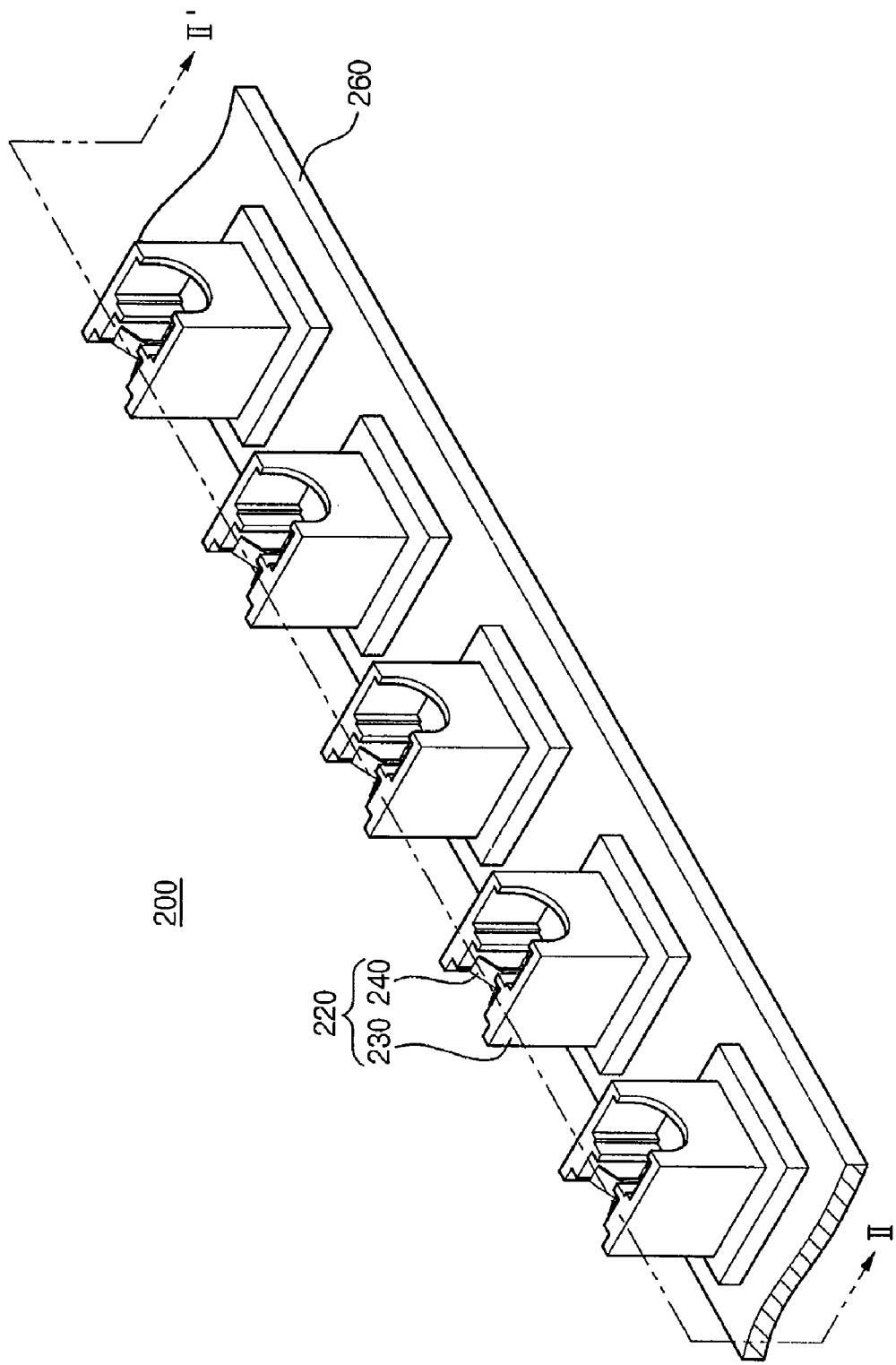
FIG. 7 is a perspective view illustrating a power supply module in accordance with one embodiment of the present invention.
Figure 8:
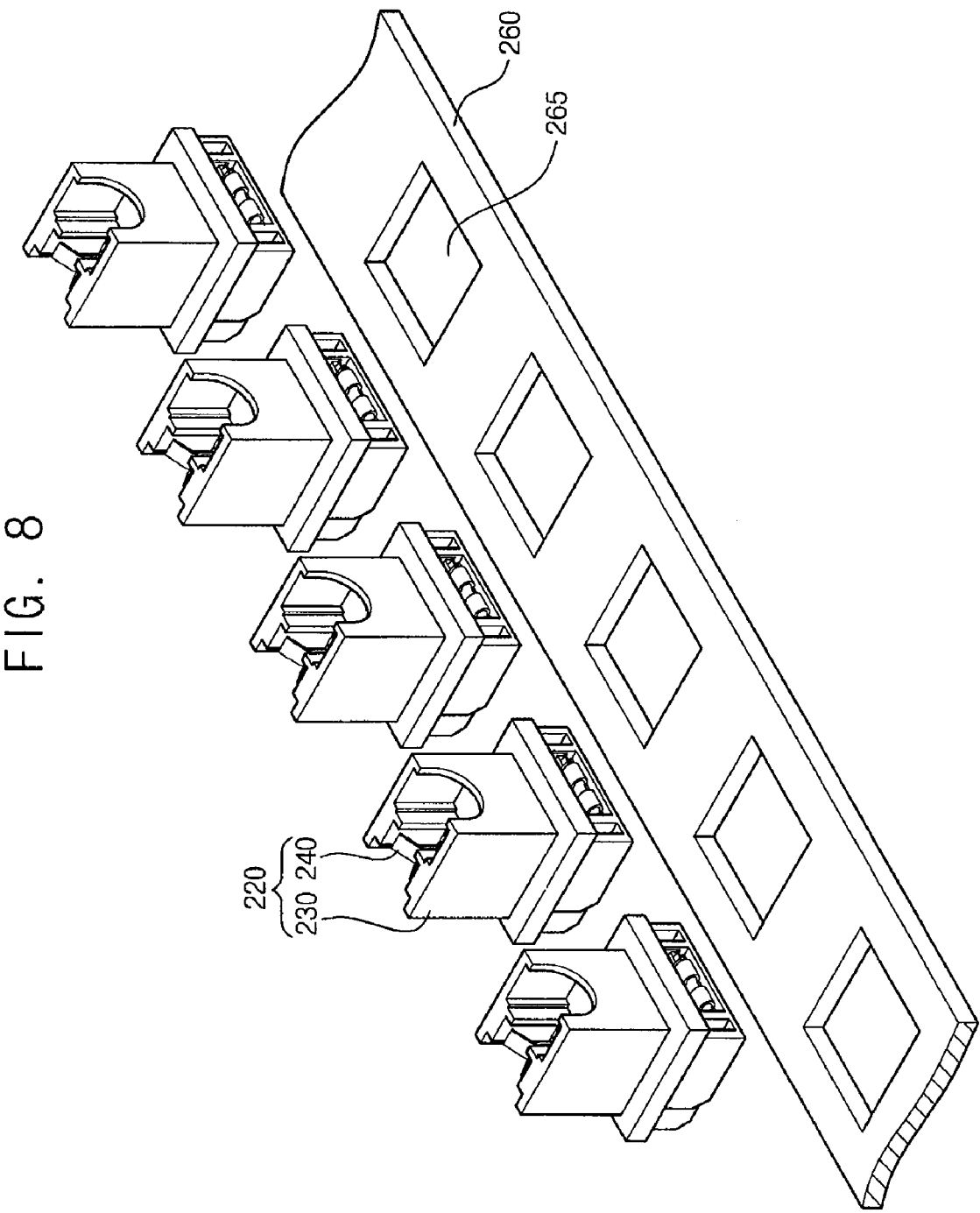
FIG. 8 is an exploded perspective view illustrating the power supply module shown in FIG. 7.
Figure 9:
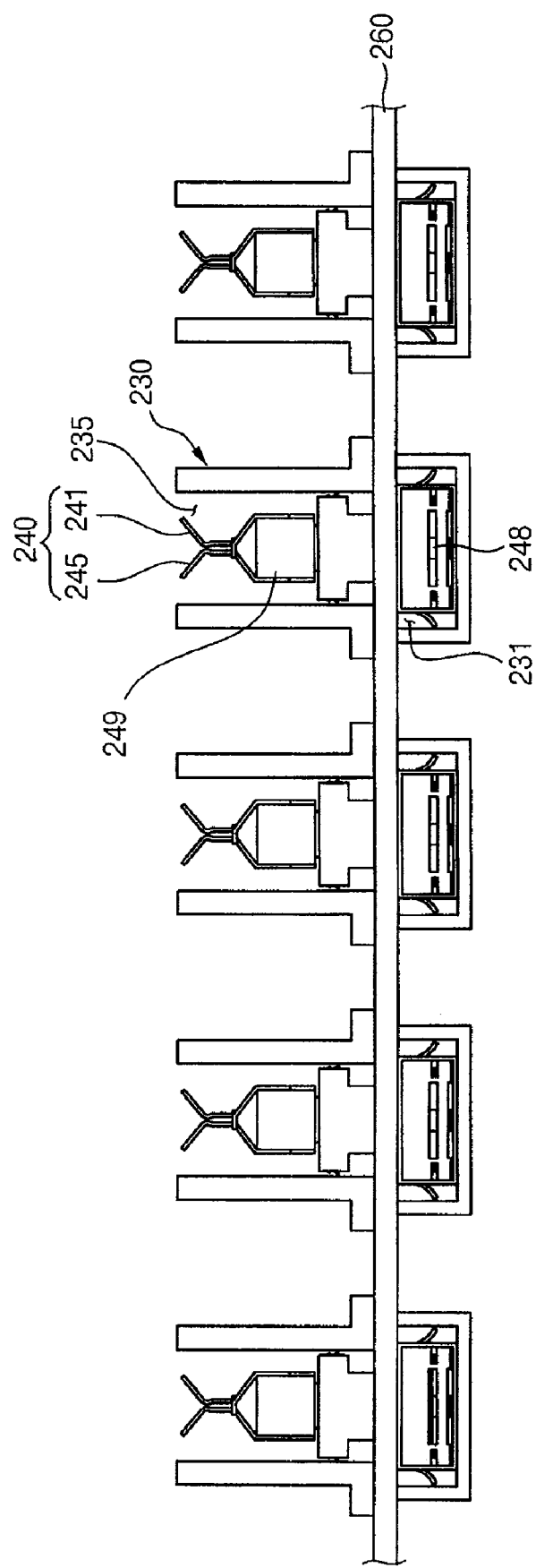
FIG. 9 is a cross-sectional view taken along a line II-II' shown in FIG. 7.

FIG. 7 is a perspective view illustrating a power supply module in accordance with one embodiment of the present invention. FIG. 8 is an exploded perspective view illustrating the power supply module shown in FIG. 7. FIG. 9 is a cross-sectional view taken along a line II-II' shown in FIG. 7.

Referring to FIGS. 7, 8 and 9, the power supply module 200 includes a connecting plate 260, a plurality of socket housings 230 and a plurality of power supply parts 240 to be combined with a plurality of lamps.

The connecting plate 260 has a plate shape and extends in a predetermined direction. A plurality of socket fixing portions 265 is formed on the connecting plate 260, spaced apart from one another by a substantially constant distance. For example, the socket fixing portions 265 may be openings 265 formed through the connecting plate 260. Alternatively, the socket fixing portions 265 may be grooves extending along the length of the connecting plate 260.

The socket housing 230 of FIGS. 7 to 9 is substantially the same as in FIGS. 1, 2 and 4.

The power supply part 240 of FIGS. 7 to 9 is substantially the same as the power supply part 40 in FIGS. 1 to 4. Thus, any further explanation concerning the above elements will be omitted. Each of the socket housings 230 combined with the power supplying part 240 is inserted into each of the socket fixing portions 265. The inverter receiving hole 231 formed at the socket housing 230 is exposed toward a lower surface of the connecting plate 260. The connecting hole 235 formed at the socket housing 230 is exposed toward an upper surface of the connecting plate 260.

Figure 10:
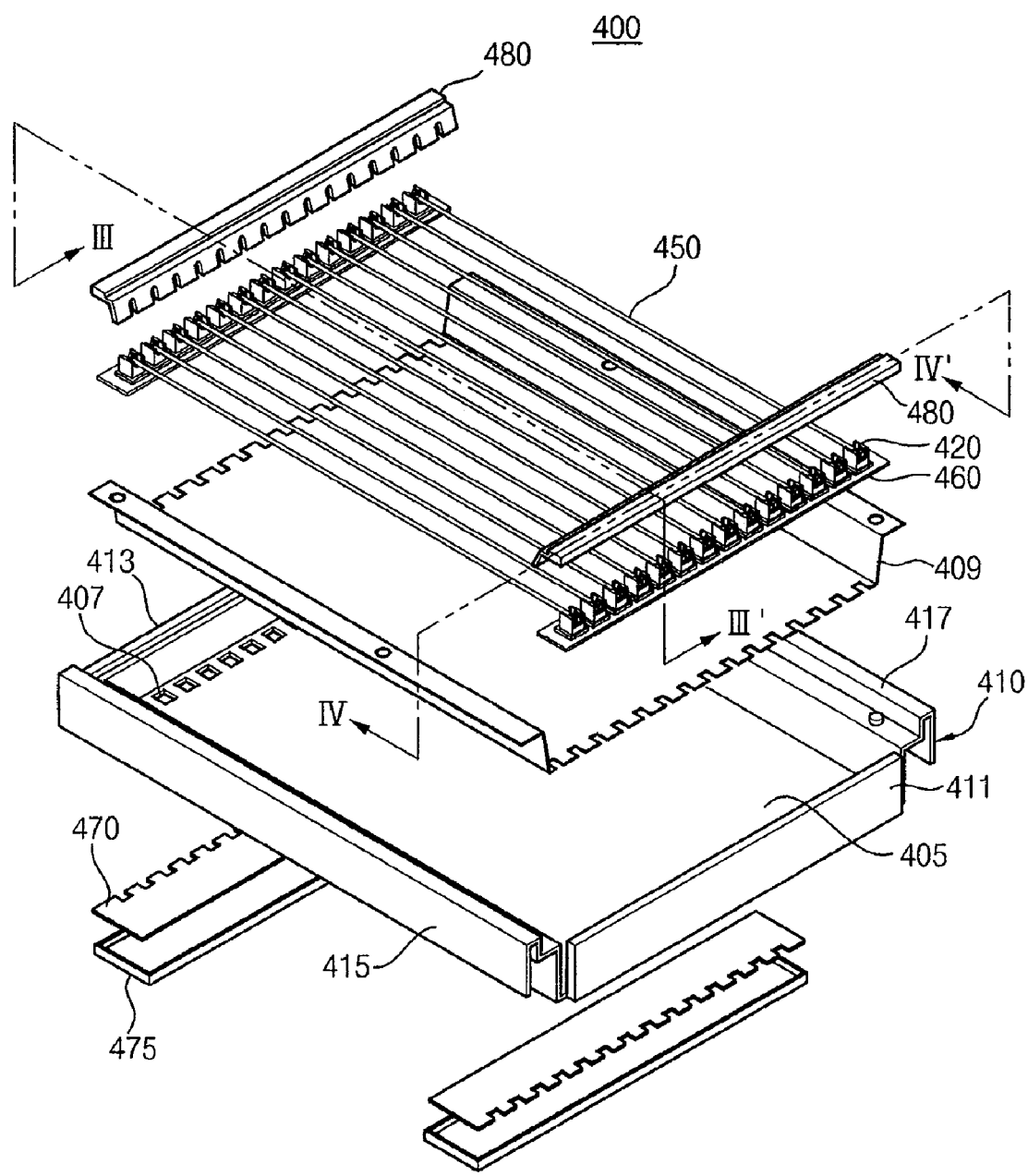
FIG. 10 is an exploded perspective view of a backlight assembly in accordance with one embodiment of the present invention.
Figure 11:
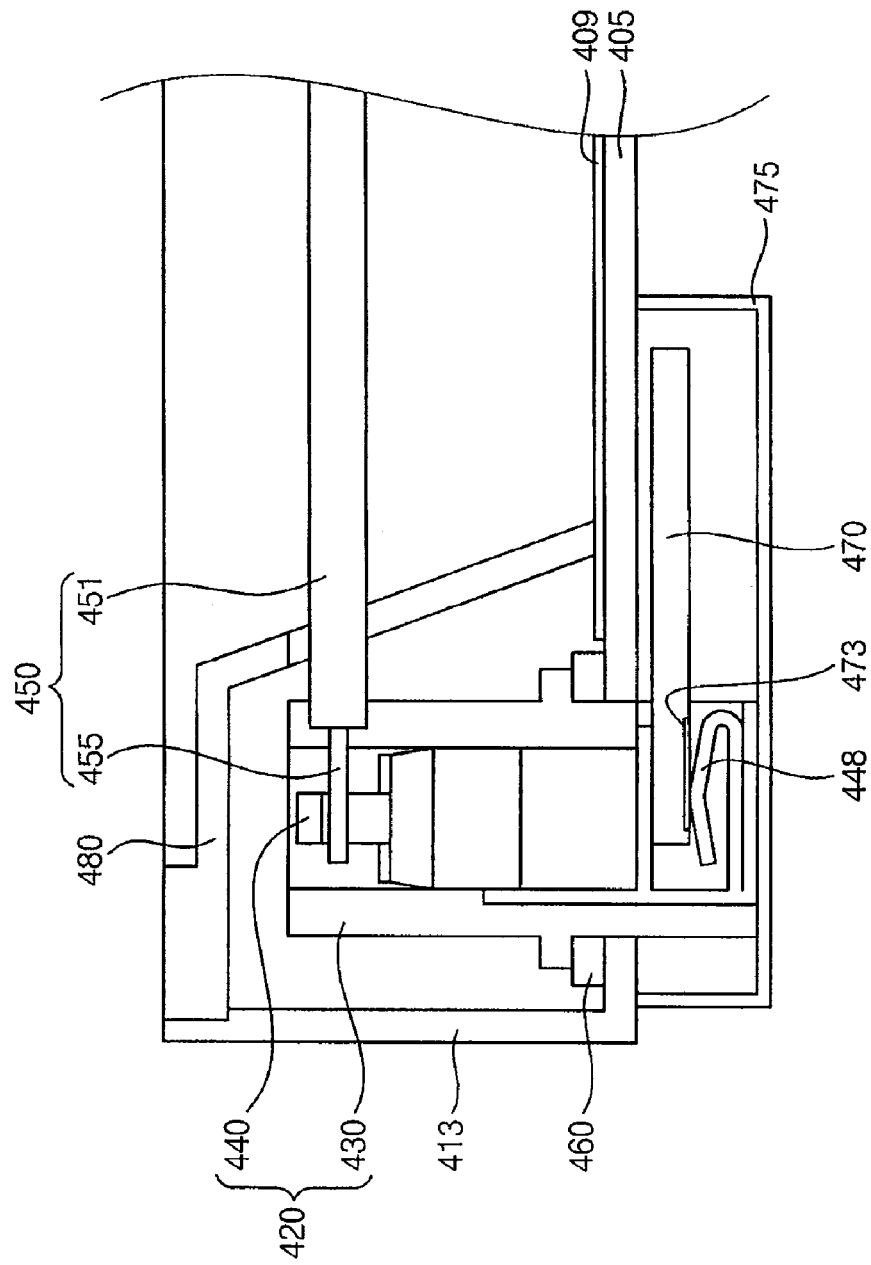
FIG. 11 is a cross-sectional view taken along a line III-III' shown in FIG. 10.
Figure 12:
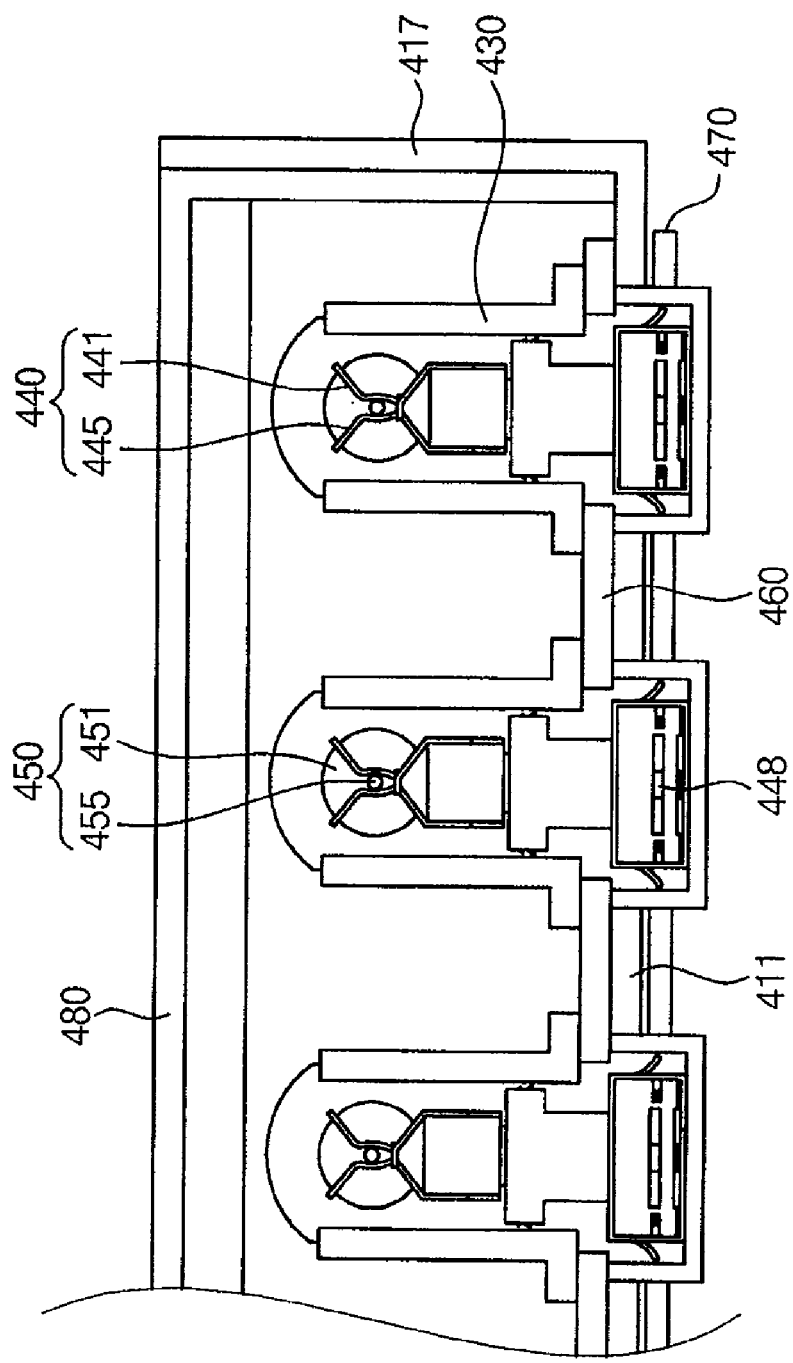
FIG. 12 is a cross-sectional view taken along a line IV-IV' shown in FIG. 10.

FIG. 10 is an exploded perspective view of a backlight assembly in accordance with one embodiment of the present invention. FIG. 11 is a cross-sectional view taken along a line III-III' shown in FIG. 10.

Referring to FIGS. 10 and 11, the backlight assembly 400 includes a receiving container 410, a plurality of lamp sockets 420, a plurality of lamps 450 and a power supply substrate 470.

The receiving container 410 includes a bottom plate 405, a first sidewall 411, a second sidewall 413, a third sidewall 415 and a fourth sidewall 417. The first, second, third and fourth sidewalls 411, 413, 415 and 417 extend from the edges of the bottom plate 405 to form a receiving space. The first and second sidewalls 411 and 413 are parallel to each other. The third and fourth sidewalls 415 and 417 are parallel to each other and connected between the first and second sidewalls 411 and 413. A stepped portion is formed on an upper portion of the first, second, third and fourth sidewalls 411, 413, 415, and 417. A plurality of openings 407 is formed on the bottom plate 405 along the first and second sidewalls 411 and 413.

The lamp socket 420 of FIGS. 10 and 11 is substantially the same as the lamp socket 20 in FIGS. 1 to 4.

Figure 6D:
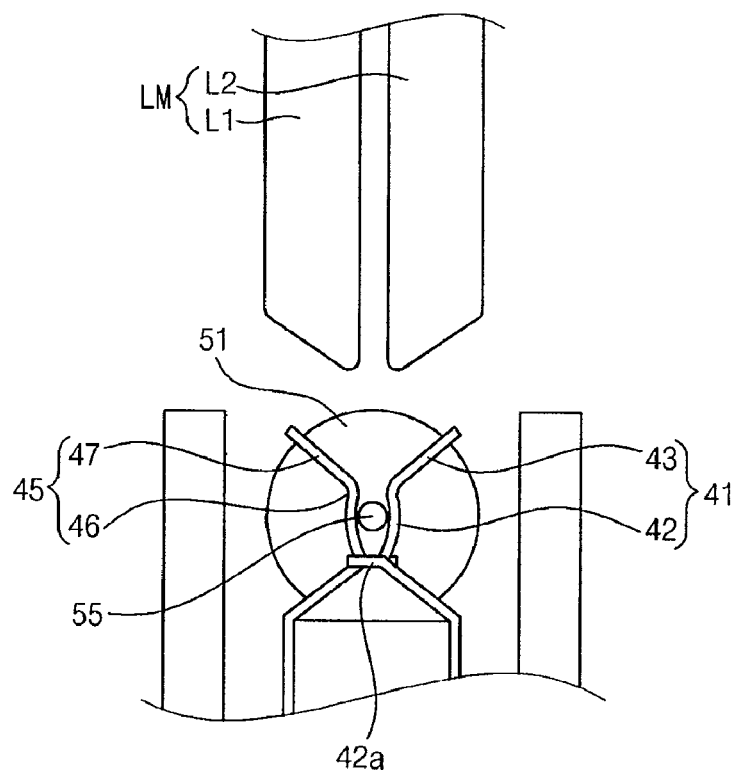

The lamps 450 are combined with the lamp sockets 420 through the same method shown in FIGS. 5 to 6D. Thus, any redundant explanation concerning the above elements will be omitted. The lamps 450 may be combined with the lamp sockets 420. Alternatively, the lamps 450 may be divided into a plurality of groups connected to the lamp sockets 420. The lamps 450 are aligned on the bottom plate 405 to generate light. For example, the lamps 450 may be aligned in a direction substantially parallel to the first and second sidewalls 411 and 413.

Each of the lamps 450 includes a lamp body 451 and an electrode portion 455. The lamp body 451 may have a cylindrical shape, and a discharge gas may be injected into the lamp body 451. The discharge gas may include argon and mercury. The electrode portion 455 is disposed on an end portion of the lamp body 451. The electrode portion 455 may include a discharge electrode and a lead wire. The discharge electrode may be disposed in the lamp body 451, and the lead wire may extend from the discharge electrode toward the exterior of the lamp body 451. Alternatively, the lamp 450 may include an EEFL.

The backlight assembly 400 may further include a connecting plate 460. The connecting plate 460 is substantially the same as the connecting plate 260 in FIGS. 7 to 9. Thus, any redundant explanation concerning the above element will be omitted. Each of the lamp sockets 420 is inserted into each of the openings formed through the connecting plate 460. The connecting plate 460 is adjacent to the first and second sidewalls 411 and 413 when the backlight assembly 400 is assembled. The lamp sockets 420 inserted into the openings of the connecting plate 460 extend through a plurality of openings 407 in the bottom plate 405. The inverter receiving hole of the lamp socket 420 is below the bottom plate 405, and the connecting hole of the lamp socket 420 is above the bottom plate 405.

The backlight assembly 400 may further include a reflecting plate 409. The reflecting plate 409 is disposed on the bottom plate 405 of the receiving container 410 to reflect the light generated from the lamps 450 toward an upper portion of the backlight assembly 400.

The power supply substrate 470 is disposed on the lower surface of the bottom plate 405 to generate a lamp driving voltage. The power supply substrate 470 may include a printed circuit board (PCB) and a power supply element mounted on the PCB.

A side of the power supply substrate 470 is inserted into the inverter receiving holes of the lamp sockets 420. The side of the power supply substrate 470 corresponding to the inverter receiving holes of the lamp socket 420 extends toward the inverter receiving holes. Thus, the side of the power supply substrate 470 has notches when viewed in plan view.

Output terminals 473 are formed on the protruded portions of the side of the power supply substrate 470. The output terminals may be formed by partially exposing conductive lines that are formed on the PCB.

The backlight assembly 400 may further include a protecting casing 475 that protects the power supply substrate 470 and blocks electromagnetic interference.

The backlight assembly 400 may further include a plurality of side covers 480.

The side covers 480 are disposed on the first and second sidewalls 411 and 413 to cover the lamp sockets 420 adjacent to the first and second sidewalls 411 and 413 and to protect the lamp sockets 420.

In FIGS. 10 and 11, the backlight assembly 400 is a direct illumination type. Alternatively, the backlight assembly 400 may be an edge illumination type.

For example, the backlight assembly of the edge illumination type may include a receiving container, a lamp, a lamp socket and a power supply substrate.

The receiving container includes a bottom plate having an opening and a sidewall extending from an edge of the bottom plate.

The lamp on the bottom plate, and includes a lamp body and an electrode portion on an end portion of the lamp body. The lamp is adjacent to the sidewall.

The lamp socket is received in the opening, and includes a socket housing and a power supply member. The socket housing has a connecting hole that extends toward the bottom plate of the receiving container. The power supply member includes a first lamp connecting terminal and a second lamp connecting terminal. The first lamp connecting terminal is inserted into the connecting hole, the first lamp connecting terminal including a first fixing portion pressing on the electrode portion of one of the lamps and a first guide portion that extends from an end portion of the first fixing portion toward a first inner wall of the connecting hole. The second lamp connecting terminal is inserted into the connecting hole, the second lamp connecting terminal including a second fixing portion pressing on the electrode portion of one of the lamps and a second guide portion that extends from an end portion of the second fixing portion toward a second inner wall of the connecting hole. The first and second inner walls are substantially parallel. The power supply substrate is coupled to the bottom plate to provide a lamp driving voltage to the power supply member.

The backlight assembly of the edge illumination type may further include a light guide plate (not shown) disposed on the bottom plate, and the lamp may face a side surface of the light guide plate so that linear light generated from the lamp may be changed into planar light by the light guide plate.

Figure 13:
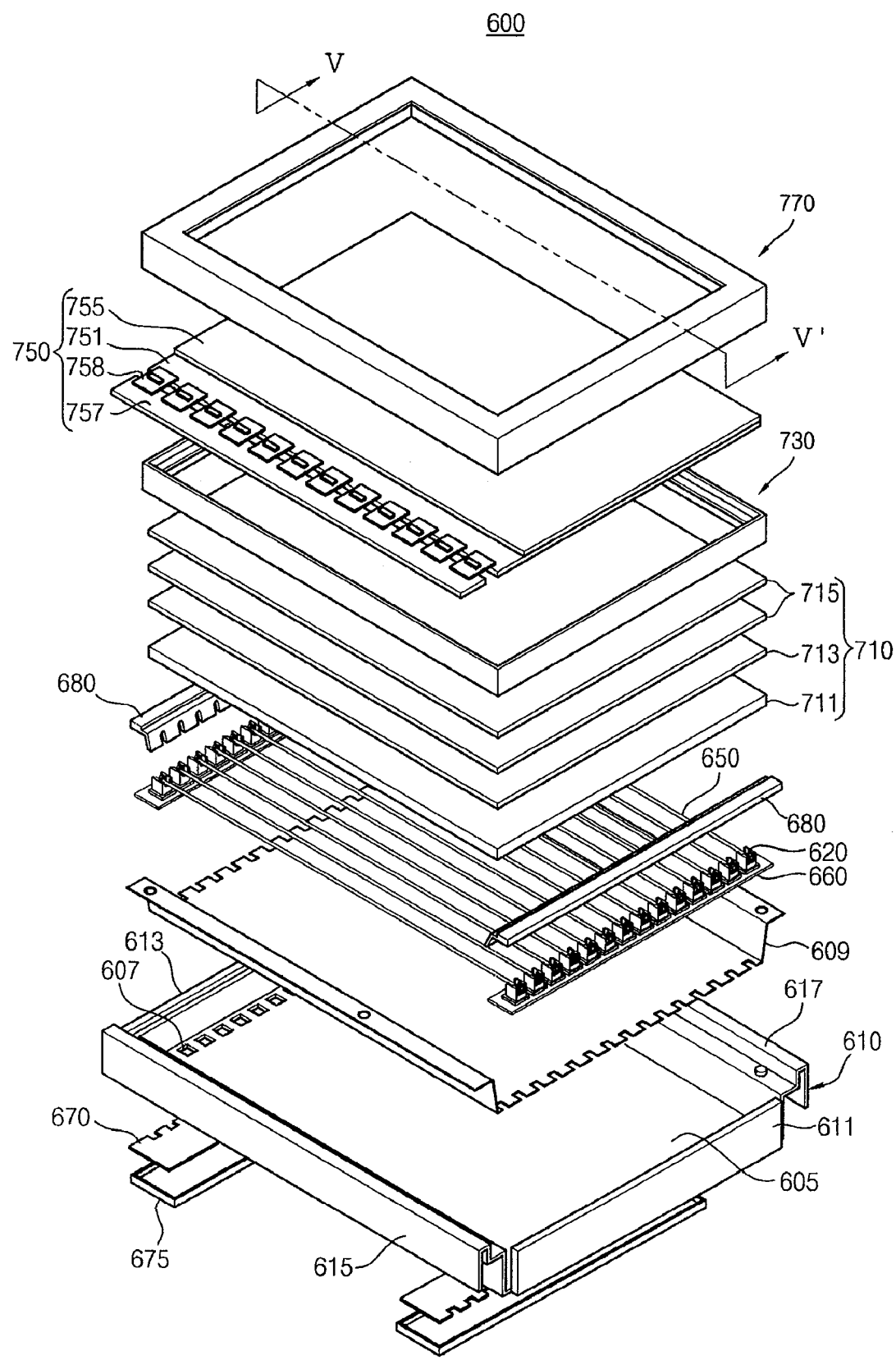
FIG. 13 is an exploded perspective view of a display in accordance with one embodiment of the present invention.

FIG. 13 is an exploded perspective view of a display device according to one embodiment of the present invention. FIG. 14 is a cross-sectional view taken along a line V-V' shown in FIG. 13.

Referring to FIGS. 13 and 14, the display device 600 includes a receiving container 610, a plurality of lamp sockets 620, a plurality of lamps 650, a connecting plate 660, a power supply substrate 670, a side cover 680, optical sheets 710 and a display panel 750.

The receiving container 610, the lamp sockets 620, the connecting plate 660, the lamps 650, the power supply substrate 670 and the side covers 680 of FIGS. 13 and 14 are substantially the same as the receiving container 410, the lamp sockets 420, the connecting plate 460, the lamps 450, the power supply substrate 470, and the side covers 480 in FIGS. 10 and 11, respectively. Thus, the same reference numerals will be used to refer to the same or like parts as those described in FIGS. 10 and 11 and any redundant explanation concerning the above elements will be omitted.

The optical sheets 710 may improve optical characteristics of the light generated from the lamps 650. The optical sheets 710 include a diffusion plate 711, a diffusion sheet 713 and a prism sheet 715 that are stacked in sequence. The diffusion plate 711, the diffusion sheet 713 and the prism sheet 715 are supported by the stepped portions formed on the third sidewall 615, the fourth sidewall 617 and the side cover 680.

The diffusion plate 711 diffuses the light generated from the lamps 650 to increase the luminance uniformity of the light. The diffusion sheet 713 also diffuses the light that passed through the diffusion plate 711. The prism sheet 715 guides the diffused light toward the front of the backlight assembly, thereby improving luminance when viewed on a plane.

The display device 600 may further include a middle frame cover 730. The middle frame cover 730 covers a peripheral portion of the optical sheets 710, and is combined with the receiving container 610.

The display panel 750 displays an image using the light that passed through the optical sheets 710. The display panel 750 includes a first substrate 751, a second substrate 755 and a liquid crystal layer (not shown) between the two substrates 751, 755. The second substrate 755 is substantially parallel to the first substrate 751. The liquid crystal layer is interposed between the first and second substrates 751 and 755.

The display device 600 may further include a panel PCB 757 and a connecting film 758. The panel PCB 757 applies panel driving signals to the display panel 750. The connecting film 758 is electrically connected between the first substrate 751 and the panel PCB 757.

The display device 600 may further include a top chassis 770 combined with the receiving container 610 or the middle frame 730, and has an opening through which an effective display region of the display panel 750 is exposed.

According to the present invention, a lamp socket only includes two elements: a socket housing and a power supply member. A socket cover, which is part of a conventional lamp socket, may be omitted. Thus, the invention decreases the number of elements of the lamp socket, a power supply module, a backlight assembly and a display device. In addition, first and second lamp connecting terminals of the power supply member are not pressed by the lamp socket, and the shape of the first and second lamp connecting terminals may be adjusted so that the lamps may be loaded through an automated assembly process. Therefore, any defect that would be caused by pressing a socket cover during the automated assembly process is prevented.

This invention has been described with reference to exemplary embodiments. However, many modifications and variations will be apparent to those skilled in the art in light of the foregoing description. Accordingly, the present invention embraces all such modifications and variations that fall within the spirit and scope of the appended claims.

What is claimed is:

1. A lamp socket comprising:
 a socket housing having a connecting hole; and
 a power supply member including:
 a first lamp connecting terminal inserted into the connecting hole, the first lamp connecting terminal including a first fixing portion that extends through the connecting hole and a first guide portion that extends from an end portion of the first fixing portion toward a first inner wall of the connecting hole, and a first protrusion offset from the first fixing portion in a first direction; and
 a second lamp connecting terminal inserted into the connecting hole, the second lamp connecting terminal including a second fixing portion that extends through the connecting hole and a second guide portion that extends from an end portion of the second fixing portion toward a second inner wall of the connecting hole that is substantially parallel to the first inner wall;
 wherein the first protrusion extends from the first fixing portion in a second direction toward the second lamp connecting terminal, so as to be disposed under a gap between the first fixing portion and the second fixing portion, the first protrusion positioned so as to prevent a lead wire of a lamp that has been inserted between the first and second fixing portions from being inserted beyond the first protrusion.

2. The lamp socket of claim 1, wherein the first and second fixing portions press on an electrode portion of a lamp to hold the electrode portion of the lamp by a restoring force.

3. The lamp socket of claim 1, wherein the first and second guide portions form a substantially V-shape so that a pressure that is applied to the inside of the V-shape is guided toward opposite walls of the lamp socket.

4. The lamp socket of claim 3, wherein the first and second lamp connecting terminals form a substantially Y-shape when viewed from a side of the lamp socket.

5. The lamp socket of claim 1, further comprising an inverter receiving hole connected to the connecting hole through the socket housing.

6. The lamp socket of claim 5, wherein the power supply member further includes an inverter connecting terminal that is integrally formed with the first and second lamp connecting terminals and is exposed through the inverter receiving hole.

7. The lamp socket of claim 6, wherein the power supply member further comprises a connecting part connecting the inverter connecting terminal with the first and second lamp connecting terminals.

8. The lamp socket of claim 7, wherein the first protrusion is formed on an upper portion of the connection part that is connected to the first lamp connecting terminal, and is further configured to restrict an amount of bending done by a lower portion of the second fixing portion, and a second protrusion is formed on the upper portion of the connection part that is connected to the second lamp connecting terminal, and is further configured to restrict an amount of bending done by a lower portion of the first fixing portion.

9. A method of assembling a lamp module, comprising:

aligning a lamp loading part on an upper portion of a lamp socket, the lamp socket including first and second lamp connecting terminals and a protrusion extending from one lamp connecting terminal toward the second lamp connecting terminal, the protrusion positioned so as to prevent an electrode portion of a lamp from being inserted into the lamp socket beyond the first protrusion, the lamp loading part holding the electrode portion of the lamp upon insertion into the lamp socket;

pressing on an upper portion of the first and second lamp connecting terminals with an end portion of the lamp loading part to increase a space between the first lamp connecting terminal and the second lamp connecting terminal;

disposing the electrode portion of the lamp in the space between the first and second lamp connecting terminals; and removing the lamp loading part from the first and second lamp connecting terminals so that the first and second lamp connecting terminals are restored substantially close to their original positions, pressing the electrode portion between them.

10. The method of claim 9, wherein the first lamp connecting terminal becomes spaced apart from the second lamp connecting terminal by lowering the end portion of the lamp loading part so that the end portion of the lamp loading portion makes contact with the upper portion of the first and second lamp connecting terminals.

\* \* \* \* \*